(12) United States Patent
Suzuki

(10) Patent No.: US 6,742,575 B2
(45) Date of Patent: Jun. 1, 2004

(54) BOILING AND CONDENSING APPARATUS

(75) Inventor: Kazutaka Suzuki, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/373,173

(22) Filed: Feb. 24, 2003

(65) Prior Publication Data

US 2003/0173063 A1 Sep. 18, 2003

(30) Foreign Application Priority Data

Feb. 26, 2002 (JP) ........................................ 2002-049576

(51) Int. Cl.⁷ ............................................... F28D 15/00
(52) U.S. Cl. .......................... 165/104.21; 165/104.33; 361/700; 257/715; 174/15.2
(58) Field of Search ............................ 165/185, 104.21, 165/104.26, 104.33; 361/700; 257/715; 174/15.2

(56) References Cited

U.S. PATENT DOCUMENTS

| 3,372,738 A | * | 3/1968 | Jan et al. ........................ 165/47 |
| 4,333,520 A | * | 6/1982 | Yanadori et al. ............... 165/59 |
| 4,350,838 A | * | 9/1982 | Harrold ....................... 174/15.1 |
| 6,005,772 A | * | 12/1999 | Terao et al. .................. 361/699 |
| 2002/0166655 A1 | * | 11/2002 | Sugito et al. ........... 165/104.21 |
| 2002/0195242 A1 | * | 12/2002 | Garner ......................... 165/274 |
| 2003/0079864 A1 | * | 5/2003 | Ohara .................... 165/104.21 |
| 2003/0150599 A1 | * | 8/2003 | Suzuki ................... 165/104.21 |

FOREIGN PATENT DOCUMENTS

| JP | 54-47159 A | * | 4/1979 | ............. 165/104.21 |
| JP | 61-156755 A | * | 7/1986 | .................. 257/715 |
| JP | 5-52491 A | * | 3/1993 | ............. 165/104.26 |

* cited by examiner

*Primary Examiner*—Terrell McKinnon
(74) *Attorney, Agent, or Firm*—Harness, Dickey & Pierce, PLC

(57) ABSTRACT

In the intermediate plates (22 to 24) between five other plates (21 to 25), a coolant flow path consisting of openings (231, 241) for delivering vaporized coolant from a boiling area (61) to tubes (3a) and a communication path (242) for delivering the condensed liquid coolant, a communication hole (232), a peripheral flow path (221) and a linear flow path (222) are formed. The liquid coolant flow path is longer than the vaporized coolant flow path and is connected to the boiling area (61) solely from below.

7 Claims, 6 Drawing Sheets

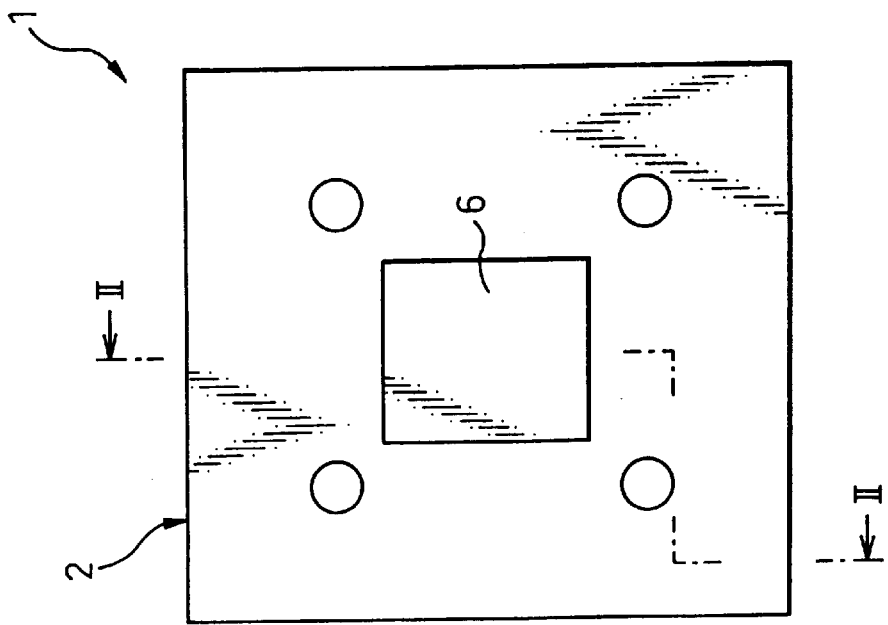
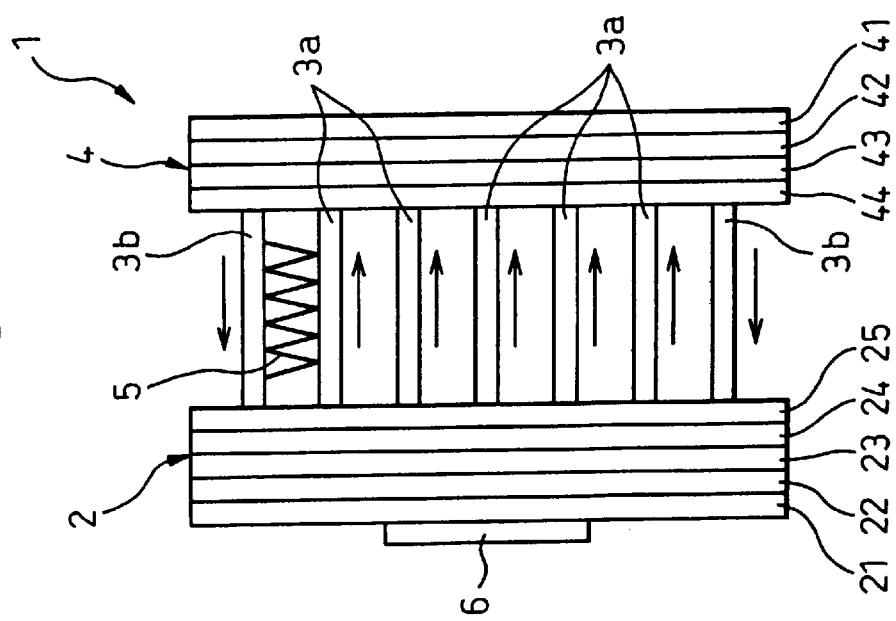

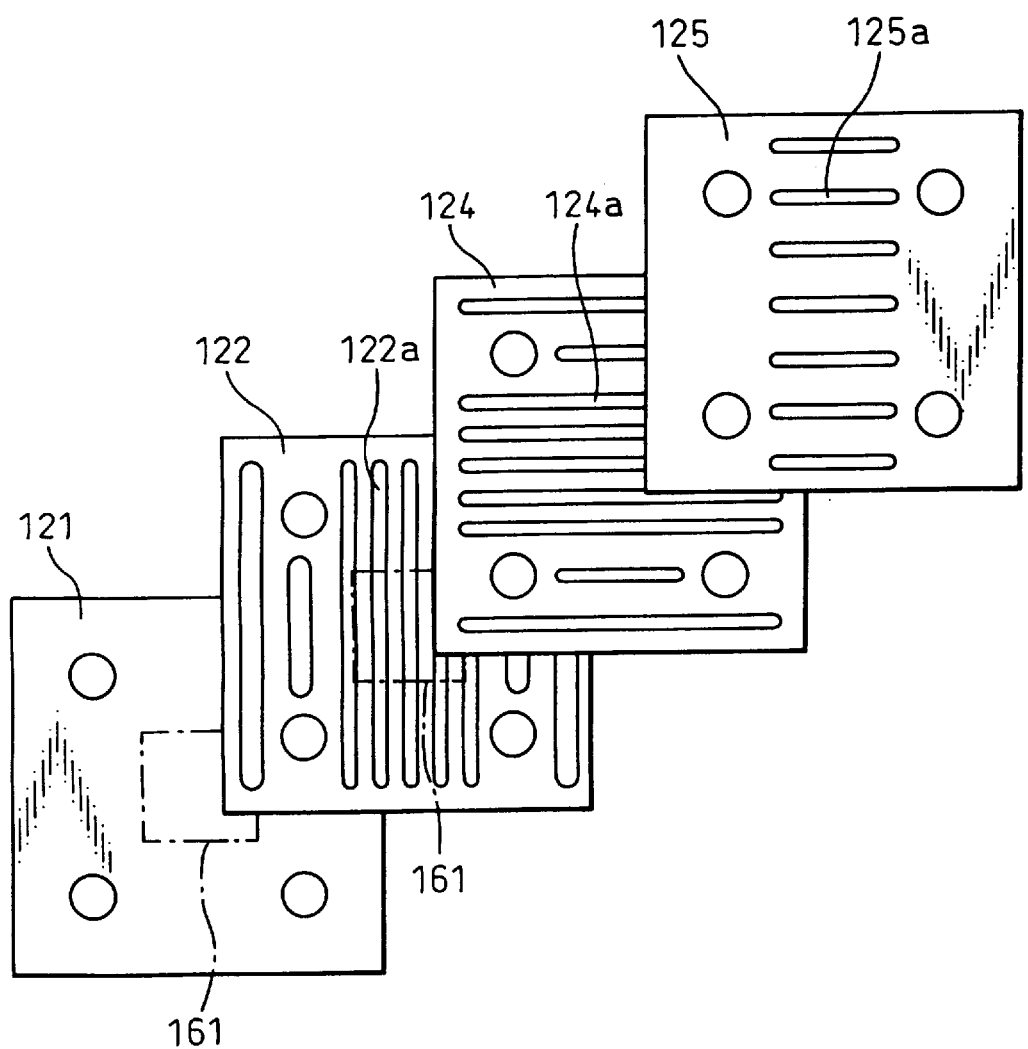

BOILING AND CONDENSING APPARATUS

BACKGROUND OF THE INVENTION

1. Technical Field of the Invention

The present invention relates to a boiling and condensing apparatus for cooling a heating element by the transferring of latent heat due to the boiling and condensation of a coolant.

2. Description of the Related Art

Various proposals have been made by the applicant of this patent application in relation to boiling and condensing apparatuses. One such boiling and condensing apparatuses includes a coolant tank, a bottom of which is brought into contact with a heating element such as heat-generating electronic parts to receive heat from the latter, a plurality of tubes arranged upright on the upper surface of the coolant tank to be communicated with the interior of the coolant tank, and a header tank for communicating the plurality of tubes with each other.

In this prior art, the coolant tank has a heat-reception plate, on which surface is attached the heating element, a heat-radiation plate, on which surface are attached the tubes, and two intermediate plates laminated to each other and disposed between the heat-reception plate and the heat-radiation plate so that a plurality of slit-like openings thereof extend through the thickness of the plates. One example of such an arrangement of the plate members used in the coolant tank of the laminated structure is shown in FIG. 6, and a sectional view of the boiling and condensing apparatus provided with this coolant tank is shown in FIGS. 7A and 7B.

An intermediate plate 124 shown in FIG. 6 is adjacent to a heat-radiation plate 125 having openings 125a for attaching the tubes. As shown in the drawing, a plurality of slit-like openings 124a extending in the lateral direction in the drawing are arranged in parallel to each other in the intermediate plate 124. Also, the intermediate plate 122 shown in FIG. 6 is adjacent to the heat-reception plate 121. As shown in the drawing, the intermediate plate 122 has a plurality of slit-like openings 122a extending parallel to each other in the vertical direction in the drawing.

When the intermediate plates 122, 124 are laminated between the heat-reception plate 121 and the heat-radiation plate 125, the slit-like openings 122a and 124a are disposed vertical to each other. Thereby, all the openings 122a and 124a are communicated with each other to form a space for storing the coolant in the coolant tank.

In this regard, a boiling area is defined by a portion of the attachment surface in the interior of the coolant tank on which the heating element is projected in the vertical direction, wherein the coolant is vaporized by receiving heat from the heating element. The boiling area is enclosed by a chain line in FIG. 6 and indicated as 161.

A boiling and condensing apparatus 101 having a coolant tank 102 formed by laminating the plates 121, 122, 124 and 125 to each other is disposed so that the coolant tank 102 is positioned on the lower side as shown in FIG. 7A. When the heating element 6 attached to the outer bottom surface of the coolant tank 102 is cooled (i.e., when used in a bottom-heat mode), the coolant stored in the coolant tank 102 receives heat from the heating element 6 and is boiled mainly in the boiling area 161.

The coolant vaporized to become a gas passes through tubes 103 mainly disposed above the boiling area 161, then passes through the interior of a header tank 104 and finally returns to the outer peripheral region of coolant tank 102 via the tubes 103 mainly disposed above the non-boiling area. At this time, the coolant in the tubes 103 radiates the latent heat outside and is condensed to a liquid coolant.

In the boiling and condensing apparatus, however, the coolant tank 102 is arranged on a lateral side as shown in FIG. 7B. When the heating element 6 attached to the outer lateral surface of the coolant tank 102 is cooled (that is, when used in a side-heat mode), the coolant flows through a path different from that in a so-called bottom-heat mode shown in FIG. 7A.

When the coolant stored in the coolant tank 102 is boiled mainly in the boiling area by receiving heat from the heating element 6, the vaporized coolant passes through the upper tubes 103 as shown in FIG. 7B, enters the header tank 104, and returns to the coolant tank 102 via the lower tubes 103. At this time, in the tubes 103, the coolant radiates the latent heat outside and is condensed to a liquid coolant.

Under the circumstances, part of the coolant boiled in the coolant tank 102 may flow in the counter direction within the coolant tank 102 or in the tubes 103 and interfere with the normal flow of the coolant. If the circulation of the coolant is not smoothly carried out in such a manner, there might be a problem in that the quenching performance is lowered.

DISCLOSURE OF THE INVENTION

The present invention has been made to solve the above-mentioned problems in the prior art by providing a boiling and condensing apparatus facilitating the circulation of coolant even if the coolant tank is disposed on the lateral side so that the apparatus is used in a side-heat mode wherein the heating element attached to the lateral outer surface of the coolant tank is quenched.

To achieve the above object, according to one aspect of the present invention, a boiling and condensing apparatus is provided which comprises a coolant tank storing coolant to be boiled by receiving heat from a heating element attached to one surface of the coolant tank, a radiator having a plurality of tubes communicated with the interior of the coolant tank and substantially standing upright from the other surface disposed opposite to the surface in the coolant tank on which the heating element is attached, and a header tank communicating the plurality of tubes with each other, wherein the coolant stored in the coolant tank receives heat from the heating element and is boiled to vaporize into a coolant vapor, from which a latent heat is radiated from the radiator to cool the heating element, wherein the plurality of tubes consists of first tubes for delivering the coolant from the coolant tank to the header tank and second tubes for delivering the coolant from the header tank to the coolant tank, a boiling area is formed in the interior of the coolant tank, for evaporating and vaporizing the coolant by the heating element, the coolant tank comprises a first coolant flow path for communicating the boiling area with the first tube, and a second coolant flow path for communicating the boiling area with the second tube, and the second coolant flow path is longer than the first coolant flow path and, when the heating element attachment surface is disposed on the lateral side, part of the second coolant flow path disposed beneath the boiling area is solely connected to the boiling area.

According to this apparatus, as the condensed liquid coolant is delivered to the boiling area solely from below via the second coolant flow path longer than the first coolant flow path, and the vaporized coolant in the coolant tank hardly flows in the reverse direction, in the second tube, to the second coolant flow path. Thus, it is possible to facilitate the coolant circulation.

Also, according to another aspect of the present invention, the boiling area is provided generally at a center of the interior of the coolant tank, and the second tube is assembled at a position outside the boiling area in the coolant tank.

Thus, as in the preceding aspect of the present invention, it is possible to easily form the second coolant flow path to be longer than the first coolant flow path and to connect the former to the boiling area solely from below.

In this case, when the heating element attachment surface is disposed on the lateral side, the second tube is assembled to the upper and lower sides on the coolant tank.

Also, according to the present invention, a plurality of second tubes are provided, and partitions are formed in the header tank so that the coolant is delivered approximately uniformly to the plurality of second tubes.

In this aspect, even if there are a plurality of second tubes, it is possible to facilitate the coolant circulation.

According to the present invention, the coolant tank is formed of a plurality of plate members laminated to each other.

In this aspect, as the plurality of plate members are laminated to each other, it is possible to easily form the coolant tank.

According to the present invention, the header tank is formed of a plurality of plate members laminated to each other.

In this aspect, it is possible to easily form the header tank by laminating the plurality of plate members with each other.

Also, according to the present invention, the radiator is provided with heat-radiation fins between the plurality of tubes.

In this aspect, it is possible to improve the heat-radiation performance of the radiator.

In a structure in which the resistance of the second coolant flow path is larger than that of the first coolant flow path, or the second coolant flow path detours around the boiling area, it is possible that the coolant vaporized in the boiling area hardly flows in reverse from the second coolant flow path in the direction of the second tube.

The present invention will be more clearly understood with reference to the attached drawing and an explanation of the preferred embodiments described hereinafter.

BRIEF DESCRIPTION OF THE DRAWINGS

FIGS. 1A and 1B schematically illustrate a boiling and condensing apparatus according to one embodiment of the present invention, wherein FIG. 1A is a side view and FIG. 1B is a view as seen from the left side of FIG. 1A;

FIG. 6 is a view for illustrating a laminated structure of a coolant tank of a related art boiling and condensing apparatus; and FIGS. 7A and 7B are sectional views of a related art boiling and condensing apparatus, wherein FIG. 7A is a sectional view of the apparatus used in the bottom-heat mode, and FIG. 7B is a sectional view of the apparatus used in the side-heat mode.

DESCRIPTION OF THE PREFERRED EMBODIMENTS

The preferred embodiments of the present invention will be described hereinafter with reference to the attached drawings.

Figure 2:
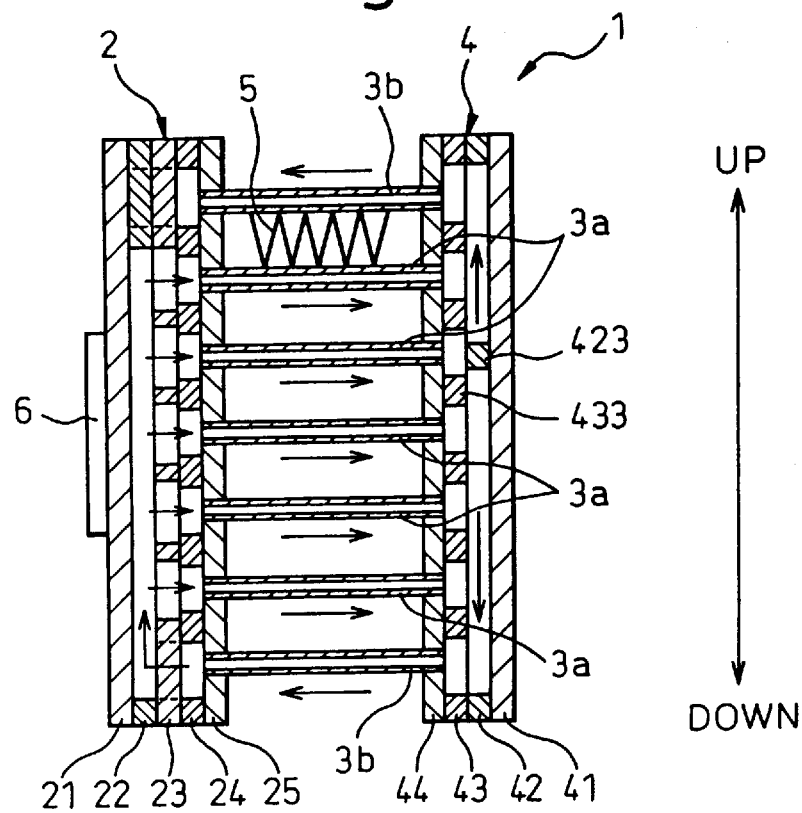
FIG. 2 is a sectional view of the embodiment of a boiling and condensing apparatus according to the present invention, used in the side-heat mode, taken along a line II—II of FIG. 1B.

FIGS. 1A and 1B schematically illustrate a boiling and condensing apparatus according to one embodiment of the present invention. FIG. 1A is a side view and FIG. 1B is a view as seen from the left side of FIG. 1A. FIG. 2 is a sectional view taken along a line II—II of FIG. 1B.

As shown in FIGS. 1A and 1B, the cooling and condensing apparatus 1 is used for cooling, for example, a heating element 6 such as a semiconductor element, and includes a coolant tank 2 for storing a coolant in the interior space thereof, a plurality of (seven in this embodiment) tubes 3a, 3b communicating with the interior space of the coolant tank 2, a header tank 4 for communicating the plurality of tubes 3a, 3b with each other, and heat-radiation fins 5 provided between the plurality of tubes 3a, 3b.

In this regard, in FIGS. 1A and 2, a heat-radiation fin 5 is shown solely in one location between a pair of tubes 3a, 3b, while eliminating the heat-radiation fins in five locations between the tubes. Note that the tube delivering the coolant from the interior of the coolant tank 2 to the header tank 4 is referred to as a first tube 3a and the tube delivering the coolant from the interior of the header tank 4 to the coolant tank 2 is referred to as a second tube 3b.

In the following description, the boiling area is defined as a region in which the heating element 6 is attached to the coolant tank 2, which is projected onto the inner side of the coolant tank 2. In the boiling area, the coolant is vaporized by receiving heat from the heating element 6.

As shown in FIGS. 1A and 2, the coolant tank 2 includes a heat-receiving plate 21 which is a plate member disposed on the attachment side, a heat-radiation plate 25 disposed on the outermost side opposite to the attachment side, and three intermediate plates 22, 23, 24 laminated to each other between the heat-receiving plate 21 and the heat-radiation plate 25.

The header tank 4 includes an outer plate 41 having the same structure as the heat-receiving plate 21 forming the coolant tank 2, an outer plate 44 having the same structure as the heat-radiation plate 25 forming the coolant tank 2, and two intermediate plates 42, 43 laminated between the two outer plates 41, 44.

Each of the heat-receiving plate 21, the heat-radiation plate 25, the outer plates 41 and 44 and the intermediate plates 42 and 43 is a metallic plate (for example, an aluminum plate or an aluminum alloy plate) capable of being soldered and excellent in thermal conductivity. They have the same rectangular shape in a plan view. Concretely, the heat-receiving plate 21 and the outer plate 41 are formed of an aluminum plate having a good thermal conductivity, and the other plates 22 to 25 and 42 to 44 are formed of an aluminum alloy plate, which is a mother material, with a solder layer on the surface thereof.

Figure 4:
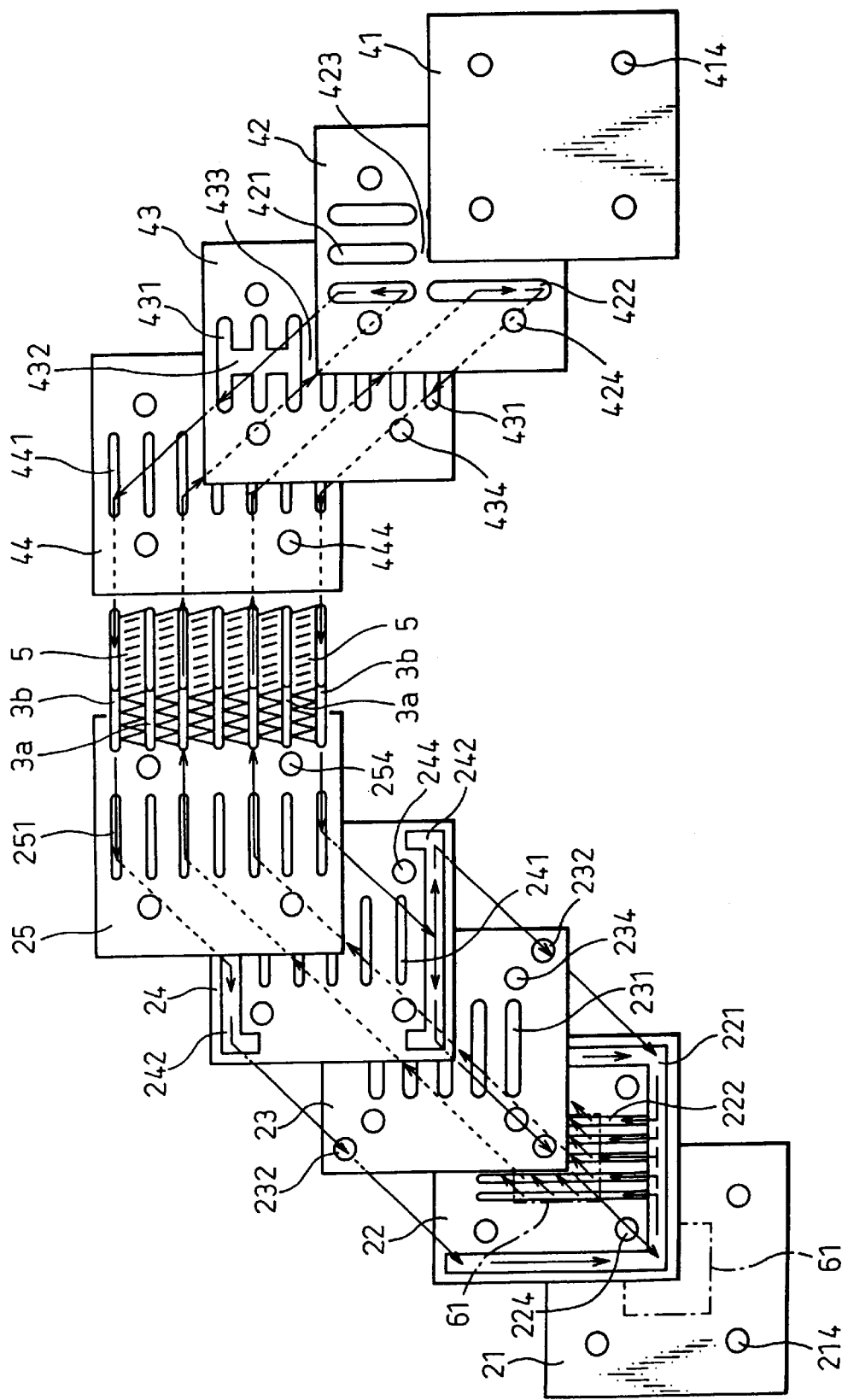
FIG. 4 is a view for illustrating a laminated structure of the embodiment of a boiling and condensing apparatus according to the present invention.

FIG. 4 is a view for illustrating a laminated structure of the boiling and condensing apparatus 1.

As shown in FIG. 4, the heat-radiation plate 25 has a plurality of slit-like openings 251. The outer plate 44 has a plurality of slit-like openings 441. These openings 251 and 441 are used for inserting tubes 3a and 3b as described later.

Each of the respective plates 21 to 25 and 41 to 44 has through-holes 214, 224, 234, 244, 254, 414, 424, 434 and 444 at a plurality of positions (four in this embodiment but some are eliminated for the purpose of clarity) corresponding to each other when laminated. These through-holes 214, 224, 234, 244, 254, 414, 424, 434 and 444 are used for attaching the cooling and condensing apparatus 2 by screws or others to an electronic instrument not shown mounting the heating element 6 thereon. In this regard, slits or others formed as coolant flow paths in the intermediate plates 22, 24, 42 and 43 are described hereinafter.

The tubes 3a, 3b are made by an extrusion molding of aluminum to have a plurality of tubular paths in the interior thereof. The heat-radiation fin 5 is made by shaping a thin aluminum plate having a good thermal conductivity into a wave shape. The thin aluminum plate forming the heat-radiation fin 5 has a solder layer on the surface thereof. The boiling and condensing apparatus 1 is formed by soldering together the respective plates 21 to 25 and 41 to 44, tubes 3a and 3b, and the heat-radiation fins 5 for forming the coolant tank 2 and the header tank 4.

In FIG. 4, an area encircled by a one-dot chain line in the heat-receiving plate 21 and the intermediate plate 22 is the above-mentioned boiling area 61. As shown in FIG. 4, the intermediate plate 22 has a U-shaped peripheral flow path 221 and a plurality of slit-like linear flow paths 222 extending from the lower edge of the peripheral flow path 221 into the boiling area 61. Also, in the intermediate plates 23, 24, five slit-like openings 231 and 241 are respectively provided at positions at which the tubes 3a are assembled to the heat-radiation plate 25.

In the intermediate plate 24, slit-like communication paths 242 extend leftward and rightward in the vicinity of the upper and lower end portions, respectively, as seen in the drawing. Also, in the intermediate plate 23, communication holes 232 are provided so that an end of the communication path 242 of the intermediate plate 24 is communicated with an end of the peripheral flow path 221 of the intermediate plate 22.

When the five plates 21 to 25 are integral with each other by laminating them together, the boiling area 61 and the tubes 3a are communicated with each other in the coolant tank 2 by the openings 231 and the 241. Also, the tubes 3b are communicated with the boiling area 61 through the communication path 242, the communication hole 232, the peripheral flow path 221 and the lower parts of the linear flow paths 222. In this regard, the openings 231 and 241 are a first coolant flow path in this embodiment, and the communication path 242, the communication hole 232, the peripheral flow path 221 and the lower parts of the linear flow path 222s are a second coolant flow path in this embodiment.

On the other hand, as shown in FIG. 4, in the intermediate plate 43, seven slit-like openings 431 are provided in correspondence with positions at which the tubes 3a, 3b are assembled to the outer plate 44. The upper three of the seven openings 431 are communicated with each other by a common slit-like communication part 432 extending in the vertical direction in the drawing.

Three slit-like openings 421 extend in the vertical direction in the drawing in an upper portion of the intermediate plate 42, and three slit-like openings 422 extend in the vertical direction in the drawing in a lower portion of the intermediate plate 42. The openings 421 are formed at positions to communicate with the upper three openings 431 in the intermediate plate 43, and the openings 422 are formed at positions to communicate with the lower five openings 431 in the intermediate plate 43. That is, when the intermediate plates 42 are laminated on the intermediate plates 43, the upper three openings 431 are communicated with each other by the opening 421, while the lower five openings 431 are communicated with each other by the opening 422.

A partition 433 is formed between the opening 421 and the opening 422. Also, in the intermediate plate 43, a partition 433 is formed between the third opening 431 and the fourth opening 431, as counted from the top, for substantially partitioning the openings. The partitions 423 and 433 are arranged at positions somewhat offset from each other when the intermediate plates 42 and 43 are laminated on each other.

As shown in FIG. 4, in the boiling and condensing apparatus formed by laminating the respective members together to be an integral body, a second coolant flow path consisting of the communication path 242, the communication holes 232, the peripheral flow path 221 and the lower portions of the linear flow paths 222 and a first coolant flow path consisting of the opening 231 and the opening 241 are separated in the coolant tank 2. Also, the second coolant flow path consisting of the communication path 242, the communication holes 232, the peripheral flow path 221 and the lower portions of the linear flow paths 222 is much longer than the first coolant flow path consisting of the opening 231 and the opening 241 and connected solely from below to the boiling area 61 via the linear flow paths 222.

The boiling area 61 is approximately at a center of the coolant tank 2, and the tube 3b, which is the second tube, is attached to upper or lower position outside the boiling area 61 in the interior of the coolant tank 2. The tube 3b attached to the upper position communicates with a space located at a location upper than the partition 433 in the header tank 4, and the tube 3b attached to the lower position communicates with a space located at a location lower than the partition 433 in the header tank 4.

According to this embodiment, the slits or holes provided in the respective plates 21 to 26 and 41 to 44 have been formed by press working. Working methods other than press working may be used for this purpose, such as cutting or etching. In this regard, although not illustrated, an injection pipe communicated with the interior space of the coolant tank 2 may be provided in the coolant tank 2. A predetermined amount of coolant is injected into the interior space through the injection pipe, after which a tip end of the injection pipe is completely sealed. Also, as a coolant, a chlorofluorocarbon is used in this embodiment.

Next, the operation of the boiling and condensing apparatus 1 of the above structure will be explained below.

First, a case in which the boiling and condensing apparatus 1 is disposed so that the surface of the coolant tank 2, to which the heating element 6 is to be attached, is on the lateral side (i.e., when used in a so-called side-heat mode), will be explained.

The coolant stored in the coolant tank 2 is boiled and vaporized mainly in the boiling area 61 by receiving heat from the heating element 6, and flows as a vaporized coolant into the tube 3a from the coolant tank 2. The coolant flowing from the coolant tank 2 into the tube 3a passes the header tank 4 and returns to the coolant tank 2 via the outer two tubes 3b.

At this time, the coolant is quenched by heat exchange to the outer air when flowing through the tubes 3a, 3b to become a condensed liquid which then returns to the coolant tank 2. By repeating the above cycle (boiling-condensation), the heating element 6 is cooled. In this regard, as the heat-radiation fins 5 are arranged between the tubes 3a and 3b, it is possible to favorably condense the coolant. Note that the structure consisting of the tubes 3a, 3b and the heat-radiation fins 5 is a radiator in this embodiment.

The circulating path will be described in more detail with reference to FIG. 4. The coolant boiled in the boiling area 61 passes the openings 231 and 241 and flows into the tube 3a assembled to the opening 251. The coolant passing the upper two tubes 3a flows into the upper tube 3b from the uppermost opening 431 via the opening 421 from the second and third openings 431 as counted from above. In this regard, in the header tank 4, part of the coolant flows to the uppermost opening 431 via the communication part 432.

On the other hand, the coolant passing through the lower three tubes 3a flows into the lower tube 3b from the lowermost opening 431 via the opening 422 from the fourth, fifth and sixth openings 431 as counted from the top. As the partitions 423 and 433 are disposed offset from each other, the vaporized coolant separated from the liquid component in the opening 422 flows into the opening 421 via a gap between the partitions 423 and 433 and then flows into the upper tube 3b.

The coolant passing the upper tube 3b flows into the upper communication path 242 and is divided into leftward and rightward flows, after which it flows into an end of the peripheral flow path 221 via the communication hole 232. The coolant passing the lower tube 3b flows into the lower communication path 242, and after being divided into leftward and rightward flows, it flows into opposite ends of the lower side of the peripheral flow path 221 via the communication hole 232. In such a manner, the coolant joined as a single stream within the peripheral flow path 221 rises in the linear flow path 222 to be returned to the boiling area 61 from below.

Figure 3:
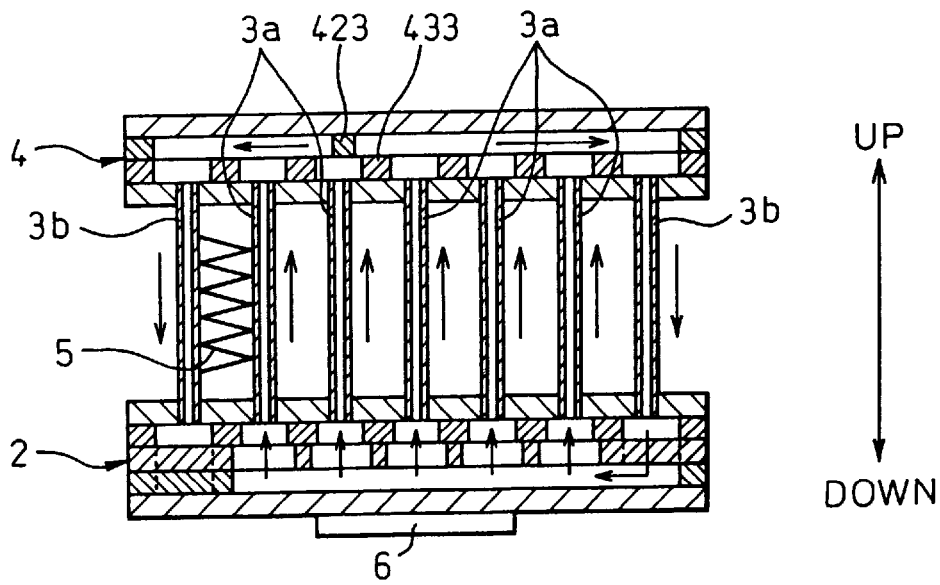
FIG. 3 is a sectional view of the embodiment of a boiling and condensing apparatus according to the present invention used in the bottom-heat mode.

Next, a case wherein the boiling and condensing apparatus 1 is disposed so that the surface of the coolant tank 2, on which the heating element 6 is to be mounted, is directed downward (as shown in FIG. 3) (i.e., when used as a so-called bottom-heat mode) will be briefly explained.

Even in this case, the coolant flows in the same paths as used in the side-heat mode as explained above with reference to FIG. 4. FIG. 3 illustrates the flow of coolant when the surface of the coolant tank 2, on which the heating element 6 is to be attached, is directed downward (i.e., when used in a so-called bottom-heat mode). As is apparent from the comparison with the side-heat mode, even if the apparatus is used in the bottom heat mode, the coolant circulates in the same manner as in the side-heat mode and cools the heating element.

According to the above structure and operation, even if the boiling and condensing apparatus 1 is used in a so-called side-heat mode as shown in FIG. 2, it is clearly partitioned and separated between the flow path of vaporized coolant flowing out from the boiling area 61 in the coolant tank 2 (that is, the above-mentioned first coolant flow path consisting of the opening 231 and the opening 241) and the flow path of liquid coolant returning to the boiling area 61 (that is, the above-mentioned second coolant flow path consisting of the communication path 242, the communication hole 232, the peripheral flow path 221 and the lower part of the linear flow path 222). Also, it is clearly separated into the tube 3a which is a coolant delivery path from the interior of the coolant tank 2 into the header tank 4 and the tube 3b which is a coolant return path from the interior of the header tank 4 into the coolant tank 2.

Further, as the second coolant flow path consisting of the communication path 242, the communication hole 232, the peripheral flow path 221 and the lower part of the linear flow path 222 is much longer than the first coolant flow path consisting of the opening 231 and the opening 241 as well as being connected to the boiling area 61 via the linear flow path 222 solely from below, the coolant boiled and vaporized in the boiling area 61 hardly flows in the reverse direction.

In addition, the partitions 423, 433 are provided in the interior of the header tank 4, whereby it is possible to approximately uniformly distribute the coolant flowing into the header tank 4 via the tube 3a to the upper and lower tubes 3b. While the coolant passing through the upper tube 3b must rise in the interior of the header tank 4, the communication part 432 is formed in the intermediate plate 43 to facilitate the rising of the coolant.

By these countermeasures, a counterflow interfering with the coolant circulation direction hardly occurs in the boiling and condensing apparatus 1 and the coolant circulation is facilitated.

Even if the boiling and condensing apparatus 1 is used in a so-called bottom-heat mode as shown in FIG. 3, it is possible to smoothly circulate the coolant in the same paths as when used in the side-heat mode.

As the coolant tank 2 and the header tank 4 are formed of five plates 21 to 25 and four plates 41 to 44, respectively, the manufacture thereof is easy.

In the above-mentioned one embodiment, the coolant tank 2 consists of the five plates 21 to 25 having the shapes shown in FIG. 4. However, it is not limited thereto provided that the flow path of vaporized coolant flowing from the boiling area 61 (the abovesaid first coolant flow path) and the liquid coolant flow path returning to the boiling area 61 (the abovesaid second coolant flow path) are clearly partitioned and separated, and the second coolant flow path is longer than the first coolant flow path and connected to the boiling area 61 solely from below when used in the side-heat mode.

In the above embodiment, the second coolant flow path is longer than the first coolant flow path. However, the second coolant flow path may have a cross-section smaller than that of the first coolant flow path and the resistance in the second coolant flow path may become larger than that in the first coolant flow path.

In the abovesaid embodiment, while the header tank 4 consists of four plates having the shapes shown in FIG. 4, it is not limited thereto provided the coolant can be approximately delivered to a plurality of tubes forming the return flow path (the tubes 3b in the abovesaid embodiment).

Figure 5:
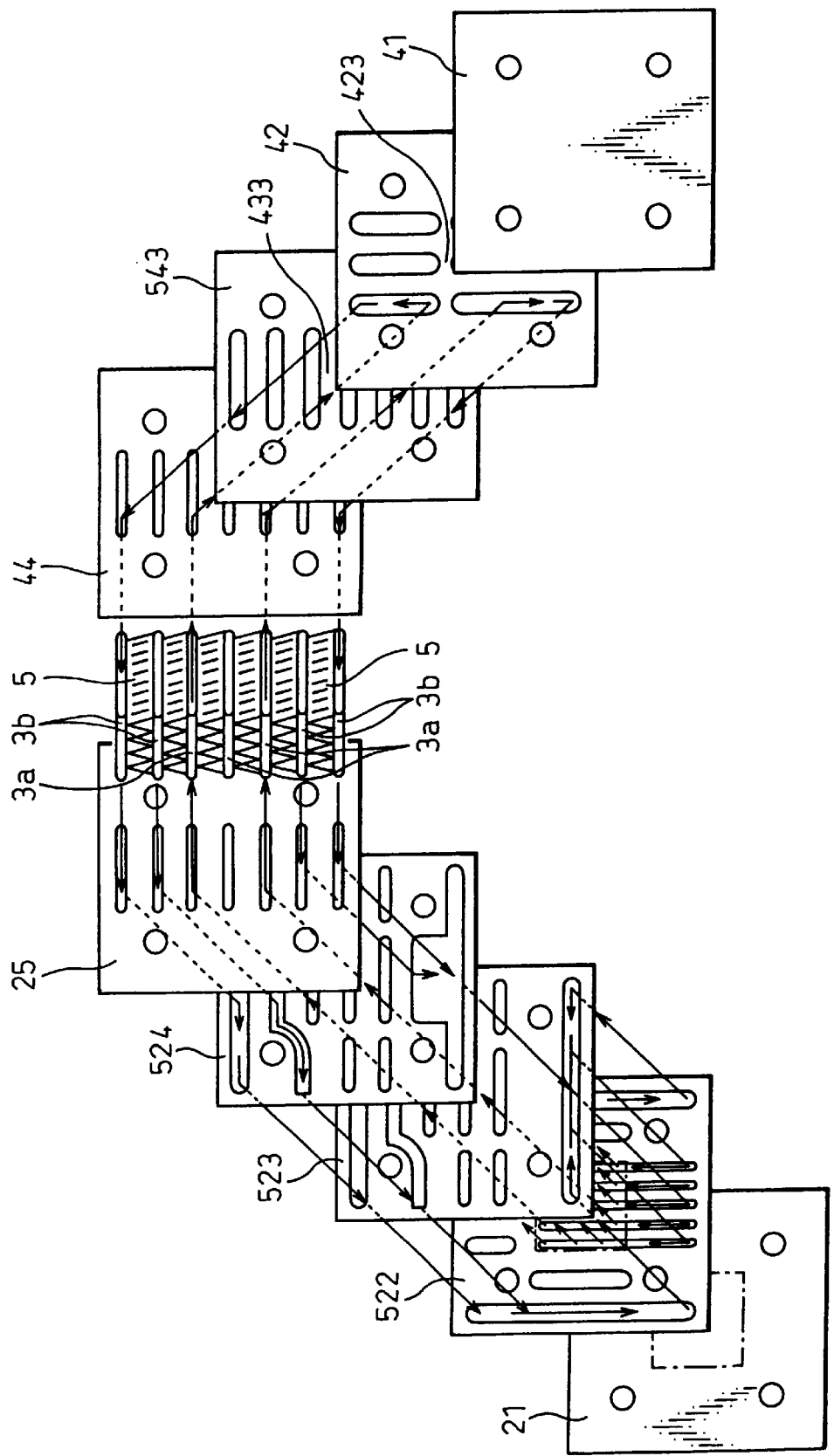
FIG. 5 is a view for illustrating a laminated structure of another embodiment of a boiling and condensing apparatus according to the present invention.
Figure 7A:
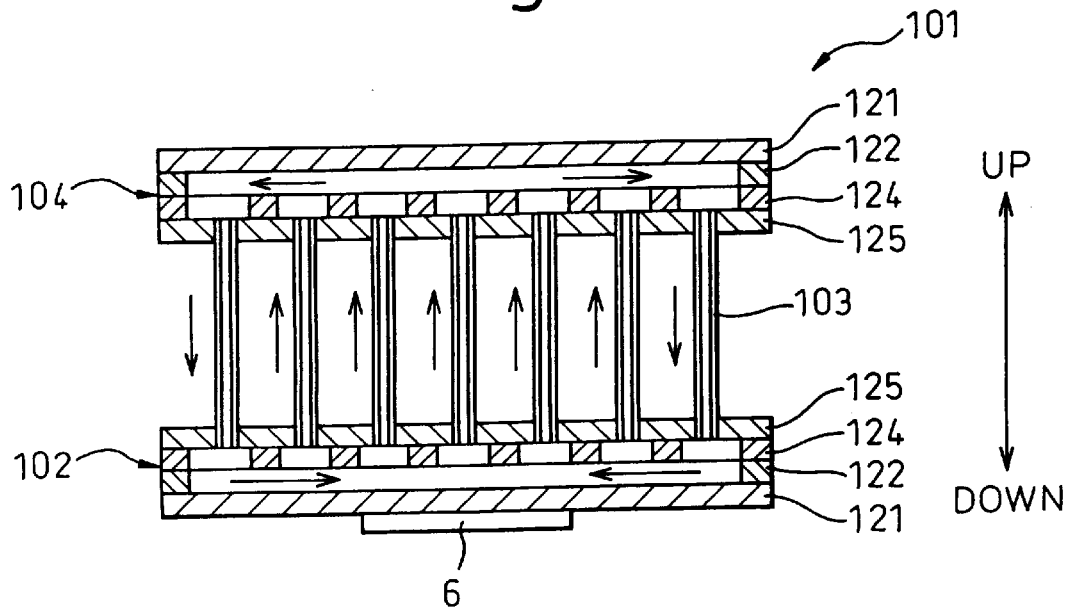
Figure 7B:
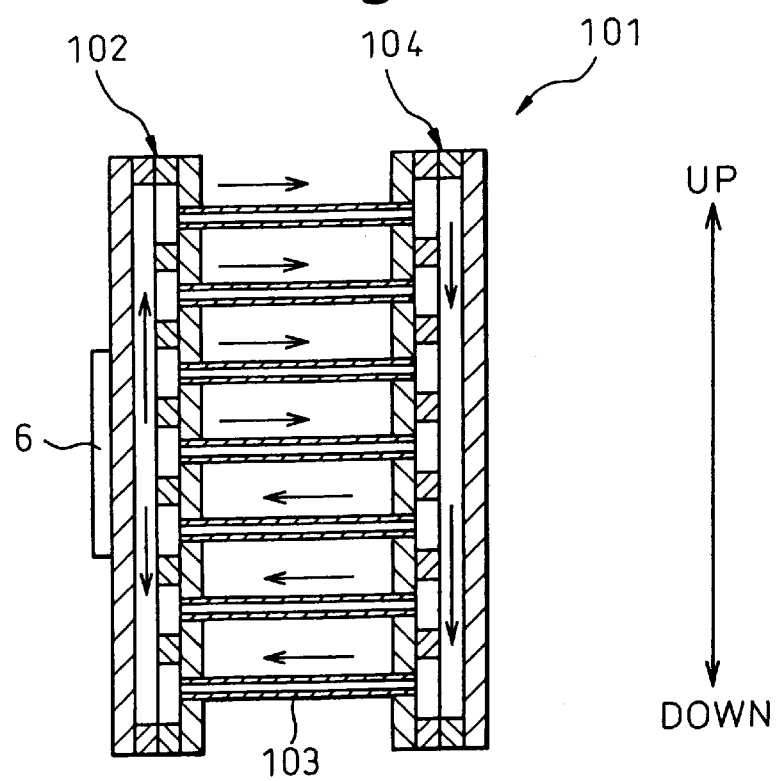

For example, as shown in FIG. 5, a coolant tank 2 may be formed by laminating plates 21, 522, 523, 524 and 25 having slits or others if necessary, and a header tank (4) may be formed by laminating plates 41, 42, 543 and 44 having slits or others if necessary.

In this regard, in FIG. 5, the same reference numerals are used for denoting similar elements shown in FIG. 4 and the explanation thereof will be eliminated. In this connection, the boiling and condensing apparatus shown in FIG. 5 has three first tubes 3a and four second tubes 3b.

In the above-mentioned embodiments, while a so-called corrugated-type heat-radiation fin 5 is provided between tubes 3, other types may be adopted. In addition, if the heat-radiation performance can be ensured, the fin may be omitted.

While the present invention has been described above in detail based on specific embodiments, it should be noted that various changes and modifications may be made by a person with ordinary skill in the art without departing from the scope of claim or spirit of the present invention.

What is claimed is:

1. A boiling and condensing apparatus comprising:
a coolant tank for storing coolant to be boiled by receiving heat from a heating element attached to one surface of the coolant tank,
a radiator having a plurality of tubes communicated with the interior of the coolant tank and substantially standing upright from the other surface disposed opposite to the surface in the coolant tank on which the heating element is attached, and
a header tank communicating the plurality of tubes with each other, wherein the coolant stored in the coolant tank receives heat from the heating element and is boiled to vaporize into a coolant vapor, from which latent heat is radiated from the radiator to cool the heating element, wherein
the plurality of tubes consists of first tubes for delivering the coolant from the coolant tank to the header tank and second tubes for delivering the coolant from the header tank to the coolant tank,
a boiling area is formed in the interior of the coolant tank, for evaporating and vaporizing the coolant by the heating element, and the coolant tank is provided with a first coolant flow path for communicating the boiling area with the first tubes and a second coolant path for communicating the boiling area with the second tubes,
a flow path resistance of the second coolant flow path is larger than that of the first coolant flow path,
when the heating element attachment surface is disposed on the lateral side, part of the second coolant flow path disposed beneath the boiling area is solely connected to the boiling area
the boiling area is provided generally at a center of the interior of the coolant tank, and the second tubes are assembled at a position outside the boiling area in the coolant tank, and
when the heating element attachment surface is disposed on the lateral side, the second tubes are assembled to the upper and lower sides on the coolant tank.

2. A boiling and condensing apparatus comprising:
a coolant tank for storing therein coolant to be boiled by receiving heat from a heating element attached to one surface of the coolant tank,
a radiator having a plurality of tubes assembled to the other surface of the coolant tank opposite to the heating element attachment surface to stand generally upright therefrom, and
a header tank communicating the plurality of tubes with each other, wherein the coolant stored in the coolant tank receives heat from the heating element and is boiled to vaporize into a coolant vapor, from which a latent heat is radiated from the radiator to cool the heating element, wherein
the plurality of tubes consists of first tubes for delivering the coolant from the coolant tank to the header tank and second tubes for delivering the coolant from the header tank to the coolant tank,
a boiling area is formed in the interior of the coolant tank, for evaporating and vaporizing the coolant tank, for evaporating and vaporizing the coolant by heat received from the heating element, and the coolant tank is provided with a first coolant flow path for communicating the boiling area with the first tubes and a second coolant path for communicating the coiling area with the second tubes,
when the heating element attachment surface is disposed on the lateral side, part of the second coolant flow path disposed beneath the boiling area is solely connected to the boiling area, and the second coolant flow path detours around the boiling area,
the boiling area is provided generally at a center of the interior of the coolant tank, and the second tubes are assembled at a position outside the boiling area in the coolant tank, and
when the heating element attachment surface is disposed on the lateral side, the second tubes are assembled to the upper and lower sides on the coolant tank.

3. A boiling and condensing apparatus comprising:
a coolant tank for storing coolant to be boiled by receiving heat from a heating element attached to one surface of the coolant tank,
a radiator having a plurality of tubes communicating with the interior of the coolant tank and substantially standing upright from the other surface disposed opposite to the surface in the coolant tank on which the heating element is attached, and
a header tank communicating the plurality of tubes with each other, wherein the coolant stored in the coolant tank receives heat from the heating element and is boiled to vaporize into a coolant vapor, from which latent heat is radiated from the radiator to cool the heating element, wherein
the plurality of tubes consists of first tubes for delivering the coolant from the coolant tank to the header tank and second tubes for delivering the coolant from the header tank to the coolant tank,
a boiling area is formed in the interior of the coolant tank, for evaporating and vaporizing the coolant by the heating element,
the coolant tank comprises a first coolant flow path for communicating the boiling area with the first tubes, and a second coolant flow path for communicating the boiling area with the second tubes, and
the second coolant flow path is longer than the first coolant flow path and, when the heating element attachment surface is disposed on the lateral side, part of the second coolant flow path disposed beneath the boiling area is solely connected to the boiling area,
the boiling area is provided generally at a center of the interior of the coolant tank, and the second tubes are assembled at a position outside the boiling area in the coolant tank, and
when the heating element attachment surface is disposed on the lateral side, the second tubes are assembled to the upper and lower sides on the coolant tank.

4. A boiling and condensing apparatus as defined by claim 3, wherein partitions are formed in the header tank so that the coolant is delivered approximately uniformly to the second tubes.

5. A boiling and condensing apparatus as defined by claim 3, wherein the coolant tank is formed of a plurality of plate members laminated on each other.

6. A boiling and condensing apparatus as defined by claim 3, wherein the header tank is formed of a plurality of plate members laminated on each other.

7. A boiling and condensing apparatus as defined by claim 3, wherein the radiator is provided with heat-radiation fins between the plurality of tubes.

* * * * *

UNITED STATES PATENT AND TRADEMARK OFFICE
CERTIFICATE OF CORRECTION

PATENT NO.   : 6,742,575 B2
DATED        : June 1, 2004
INVENTOR(S)  : Kazutaka Suzuki It is certified that error appears in the above-identified patent and that said Letters Patent is hereby corrected as shown below:

<u>Column 9,</u>
Line 65, delete "coiling" and substitute -- boiling -- therefor Signed and Sealed this Fifth Day of October, 2004

JON W. DUDAS
*Director of the United States Patent and Trademark Office*